(12) United States Patent
Morita

(10) Patent No.: US 7,919,856 B2
(45) Date of Patent: *Apr. 5, 2011

(54) PACKAGE MOUNTED MODULE AND PACKAGE BOARD MODULE

(75) Inventor: Yoshihiro Morita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 392 days.

This patent is subject to a terminal disclaimer.

(21) Appl. No.: 11/838,431

(22) Filed: Aug. 14, 2007

(65) Prior Publication Data

US 2007/0278647 A1 Dec. 6, 2007

Related U.S. Application Data

(63) Continuation of application No. PCT/JP2005/002274, filed on Feb. 15, 2005.

(51) Int. Cl.
*H01L 23/34* (2006.01)

(52) U.S. Cl. . 257/718; 257/686; 257/720; 257/E23.084; 361/767

(58) Field of Classification Search .................. 257/686, 257/E23.001, E21.499, 718, 719, 767, E23.083, 257/E23.084, E23.085; 361/767, 719; 355/3; 438/111; 439/73

See application file for complete search history.

(56) References Cited

U.S. PATENT DOCUMENTS

| | | | | |
|---|---|---|---|---|
| 4,322,156 A | * | 3/1982 | Kohyama | 399/50 |
| 5,528,462 A | * | 6/1996 | Pendse | 361/767 |
| 6,285,553 B1 | * | 9/2001 | Suyama et al. | 361/719 |
| 6,541,855 B2 | * | 4/2003 | Uzuka | 257/712 |
| 6,638,790 B2 | * | 10/2003 | Minamio et al. | 438/111 |
| 6,743,026 B1 | * | 6/2004 | Brodsky | 439/73 |
| 6,992,899 B2 | * | 1/2006 | Alger et al. | 361/767 |
| 7,132,744 B2 | * | 11/2006 | Zhao et al. | 257/706 |

FOREIGN PATENT DOCUMENTS

| | | |
|---|---|---|
| JP | 02-116197 A | 4/1990 |
| JP | 8-222658 A | 8/1996 |
| JP | 10-243326 A | 9/1998 |
| JP | 11-265967 A | 9/1999 |
| JP | 2001-320145 A | 11/2001 |
| JP | 2002-263972 A | 9/2002 |
| JP | 2003-258153 A | 9/2003 |
| JP | 2004-214284 A | 7/2004 |

OTHER PUBLICATIONS

International Search Report of PCT/JP2005/002274, date of mailing Mar. 22, 2005.
Translation of International Preliminary Report on Patentability mailed Aug. 30, 2007 of International Application No. PCT/JP2005/002274.

* cited by examiner

*Primary Examiner* — Matthew E Warren
*Assistant Examiner* — Fang-Xing Jiang
(74) *Attorney, Agent, or Firm* — Westerman, Hattori, Daniels & Adrian, LLP

(57) ABSTRACT

A package board module wherein a semiconductor chip such as an LSI is mounted on the topside surface of a package board, and a package mounted module wherein the package board is mounted on the motherboard of a large-sized computer or the like. A stiffener for supporting the package board and/or a stiffener for supporting the motherboard each has a bimetal structure wherein a first member and a second member having mutually different thermal expansion coefficients are respectively adhered to each other, so as to cause the stiffeners to warp in harmony with the warpage of the package board and the motherboard caused by a temperature change, thereby preventing stress from arising in the solder-bonded portions.

5 Claims, 4 Drawing Sheets

PACKAGE MOUNTED MODULE AND PACKAGE BOARD MODULE

TECHNICAL FIELD

The present invention relates to a package board module wherein a semiconductor chip, such as an LSI, is mounted on the topside surface of a package board, and to a package mounted module wherein the package board is mounted on the motherboard of a large-sized computer or the like.

BACKGROUND ART

In recent years, it has become common to mount a large package having more than 2000 terminal pins on a board (mainly motherboard) of a large-scale computing machine, such as a large-sized computer, because of an increase in the number of signals, and the size of such a large package has also increased to the extent of exceeding 40 mm×40 mm. Since the package is so large in size that it is equipped with stiffeners intended to prevent the warpage of the package as a whole.

FIG. 4 is a schematic cross-sectional view illustrating a conventional package board module.

In a package board module 10 illustrated in FIG. 4, an LSI chip 12 is mounted on the topside surface of a package board 11 by the fusion and fixation of solder balls 13. In addition, the package board module 10 is provided with a stiffener 14 fixed in contact with the topside surface of the package board 11 so as to surround the LSI chip 12. The stiffener 14 is intended to support the package board 11 and prevent the warpage of the package board 11. The package board module 10 has solder balls 15 on the underside surface of the package board 11 and the package board 11 is mounted on a motherboard, as will be explained hereinafter with reference to FIG. 5.

FIG. 5 is a cross-sectional configuration diagram illustrating a conventional package mounted module.

Here, components of the package board module same as those illustrated in FIG. 4 are assigned with the same reference numerals and will not be explained again.

In a package mounted module 20 illustrated in FIG. 5, the entirety of the package board module 10 illustrated in FIG. 4 is mounted on the topside surface of a motherboard 21 by the fusion and fixation of solder balls 15 on the underside surface of the package board 11 shown in FIG. 4. In addition, a stiffener 22 is disposed on the underside surface of the motherboard 21 in a position to interpose the motherboard 21 between the stiffer 22 and the package board 11. The stiffener 22 has an area wider than that of the package board 11, and the motherboard 21 and the stiffener 22 are fixed to each other with fastening components (screws 23 here) at plural locations on the periphery of the stiffener 22 falling outside the package board 11 in a schematic view of a stack of the package board 11, motherboard 21 and stiffener 22.

FIG. 6 is an explanatory diagram illustrating a problem with the conventional package mounted module shown in FIG. 5.

Conventionally, the stiffeners 14 and 22 have been formed using a single metal and, therefore, a difference in the temperature of an assembly between a solder melting point and a normal temperature or a temperature difference between the points in time of apparatus operation and apparatus shutdown causes curvature to take place between the LSI chip 12 and the package board 11 and between the package board 11 and the motherboard 21 due to a difference in the thermal expansion coefficient. Under normal conditions, the thermal expansion coefficients of the package board 11 and the motherboard 21 are as large as approximately 9 to 15 ppm/K and 17 to 22 ppm/K, respectively, as compared with the thermal expansion coefficient (approximately 4 ppm/K) of the LSI chip 12. Consequently, as illustrated in FIG. 6, the package mounted module 20 cools down to a normal temperature while being warped toward the motherboard 21 (convex toward the package board 11) after being subjected to solder bonding at a temperature equal to or higher than a solder melting point. Although the package board 11 and the motherboard 21 remain temporarily warped at this point, the package board 11 is forcibly corrected to be flat by the stiffener 14, and the motherboard 21 is also forcibly corrected to be flat by the stiffener 22 since the stiffeners 14 and 22 are flat, thereby causing stresses to arise in solder-bonded portions between the LSI chip 12 and the package board 11 and between the package board 11 and the motherboard 21. These stresses are one of the causes for significantly degrading the reliability of solder bonding and should preferably be reduced. This is especially true in recent years, as the use of lead has been prohibited by regulations on hazardous substances, and high melting point solder such as tin-silver-copper solder (melting point: 218° C.) has come into use in place of conventionally used eutectic tin-lead solder (melting point: 183° C.). As a result, the range of temperatures from a solder melting point to a normal temperature has widened, thereby causing more intense stress to occur.

Note here that Patent Document 1 proposes providing a bimetal structure to a board to allow the bimetal to operate in the reverse direction of the warpage of the board caused by a temperature change from a solder melting point to a normal temperature, thereby preventing the board from becoming warped.

However, this approach is intended to correct the warpage of the board by the board itself instead of correcting the warpage by the stiffeners 14 and 22, as has been explained with reference to FIGS. 4 to 6, and is not intended to prevent the occurrence of stress caused by forcibly correcting the warpage of the board.

Patent Document 1: Japanese Patent Laid-Open No. 2-116197

DISCLOSURE OF THE INVENTION

In view of the circumstances described above, it is an object of the present invention to provide a package mounted module and a package board module wherein stress arising in solder-bonded portions is reduced.

A package mounted module of the present invention for achieving the object includes:

a package board on the topside surface of which a semiconductor chip is mounted;

a motherboard onto the topside surface of which the underside surface of the package board is solder-bonded; and a first stiffener disposed on the underside surface of the motherboard in a position to interpose the motherboard between the first stiffener and the package board and fixed to the motherboard with fastening components, wherein the first stiffener has one surface that is farther from the motherboard than the other surface thereof in contact with the underside surface of the motherboard and that has a thermal expansion coefficient larger than that of the other surface.

Note here that in the package mounted module of the present invention, the first stiffener may have a bimetal structure formed of a first member in contact with the underside surface of the motherboard and a second member in contact with one surface of the first member farther from the motherboard than the other surface thereof and having a thermal expansion coefficient larger than that of the first member.

In addition, in the package mounted module of the present invention, screws are employed in general as the fastening components and the package board is solder-bonded to the topside surface of the motherboard by the fusion and fixation of solder balls arranged on the underside surface of the package board.

According to the package mounted module of the present invention, the first stiffener warps in harmony with the warpage of the motherboard if the motherboard warps, since the first stiffener has, for example, a bimetal structure or the like, and one surface of the first stiffener farther from the motherboard than the other surface thereof has a thermal expansion coefficient larger than that of the other surface. Accordingly, the first stiffener supports the motherboard without forcibly correcting the warpage thereof, thereby preventing stress from arising in solder-bonded portions between the underside surface of the package board and the topside surface of the motherboard. Thus, it is possible to maintain the reliability of solder bonding in the solder-bonded portions at a high level.

Furthermore, it is preferable that the package mounted module of the present invention be provided with a second stiffener fixed in contact with the topside surface of the package board so as to surround the semiconductor chip mounted on the topside surface of the package board, and the second stiffener has one surface that is farther from the package board than the other surface thereof in contact with the topside surface of the package board and that has a thermal expansion coefficient smaller than that of the other surface.

Note here that the second stiffener may have a bimetal structure formed of a first member in contact with the topside surface of the package board and a second member in contact with one surface of the first member farther from the package board than the other surface thereof and having a thermal expansion coefficient smaller than that of the first member.

If the package mounted module is provided with such a second stiffener having, for example, a bimetal structure wherein one surface of the second stiffener farther from the package board than the other surface thereof in contact with the package board has a thermal expansion coefficient smaller than that of the other surface, it is possible to let the second stiffener warp in harmony with the warpage of the package board at each temperature level. Thus, it is possible to prevent stress from arising in solder-bonded portions between the semiconductor chip and the package board, while supporting the package board by the second stiffener.

In addition, a package board module of the present invention includes:

a package board on the topside surface of which a semiconductor chip is mounted; and a stiffener fixed in contact with the topside surface of the package board so as to surround the semiconductor chip, wherein the stiffener has one surface that is farther from the package board than the other surface thereof in contact with the topside surface of the package board and that has a thermal expansion coefficient smaller than that of the other surface.

Note here that in the package board module of the present invention, the stiffener may have a bimetal structure formed of a first member in contact with the topside surface of the package board and a second member in contact with one surface of the first member farther from the package board than the other surface thereof and having a thermal expansion coefficient smaller than that of the first member.

According to the package board module of the present invention, it is possible to let the stiffener warp in harmony with the warpage of the package board at each temperature level in the same manner as described above. Thus, it is possible to prevent stress from arising in solder-bonded portions between the semiconductor chip and the package board, while supporting the package board by the stiffener.

As described above, according to the present invention, it is possible to prevent stress from arising in solder-bonded portions while letting the stiffener play the role of supporting a board (package board or motherboard), since there is provided a stiffener structured so as to warp in response to a temperature level. Thus, it is possible to maintain the reliability of solder bonding at a high level.

BEST MODE FOR CARRYING OUT THE INVENTION

Embodiments of the present invention will hereinafter be described.

Figure 1:
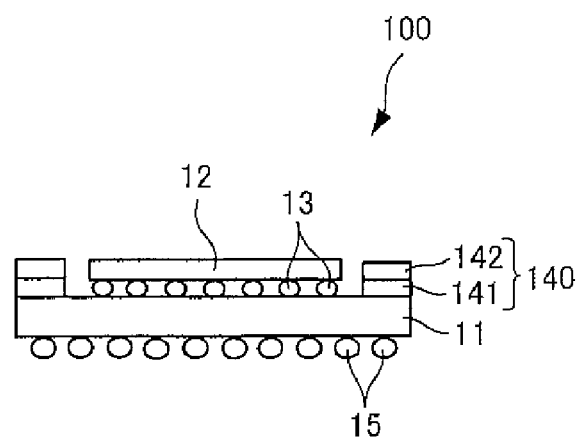
FIG. 1 is a cross-sectional configuration diagram illustrating a package board module according to an embodiment of the present invention.

FIG. 1 is a schematic cross-sectional view illustrating a package board module according to an embodiment of the present invention.

Figure 4:
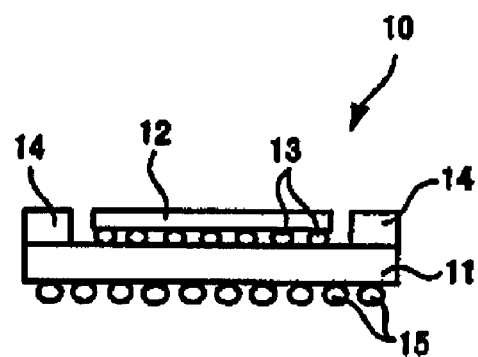
FIG. 4 is a cross-sectional configuration diagram illustrating a conventional package board module.
Figure 5:
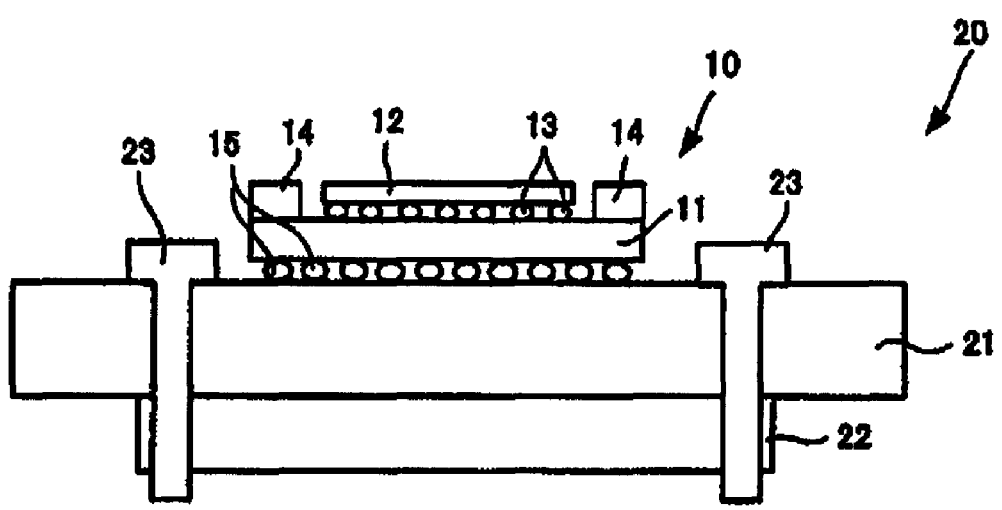
FIG. 5 is a cross-sectional configuration diagram illustrating a conventional package mounted module.
Figure 6:
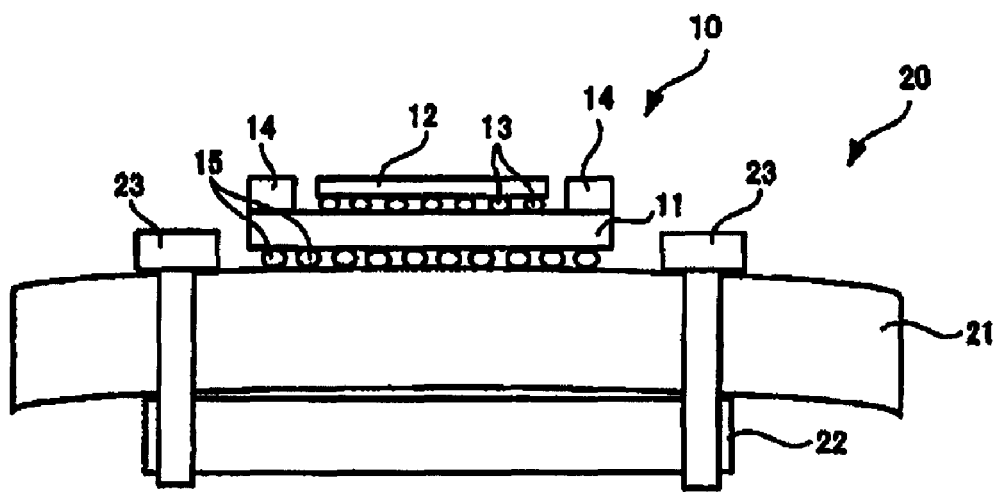
FIG. 6 is an explanatory diagram illustrating a problem with the conventional package mounted module shown in FIG. 5.

In FIG. 1, elements same as those shown in FIG. 4 which is a drawing of a conventional package board module are assigned with the same reference numerals as those assigned to FIG. 4.

In a package board module 100 illustrated in FIG. 1, an LSI chip 12 is mounted on the topside surface of a package board 11 by the fusion and fixation of solder balls 13. In addition, the package board module 100 is provided with a stiffener 140 fixed in contact with the topside surface of the package board 11 so as to surround the LSI chip 12. The stiffener 140 has a structure wherein a first member 141 in contact with the topside surface of the package board 11 and a second member 142 in contact with a surface of the first member 141 farther from the package board 11 than the other surface thereof are adhered to each other. Note here that the second member 142 has a thermal expansion coefficient smaller than that of the first member 141 and, therefore, contracts to a smaller extent than does the first member 141 when temperature drops. Consequently, the second member 142 warps in harmony with the warpage of the package board 11 at each temperature level from the fusion temperature of solder balls 13 to a normal temperature, while supporting the package board 11. Accordingly, it is possible to significantly reduce stress arising in solder-bonded portions between the LSI chip 12 and the package board 11.

Figure 2:
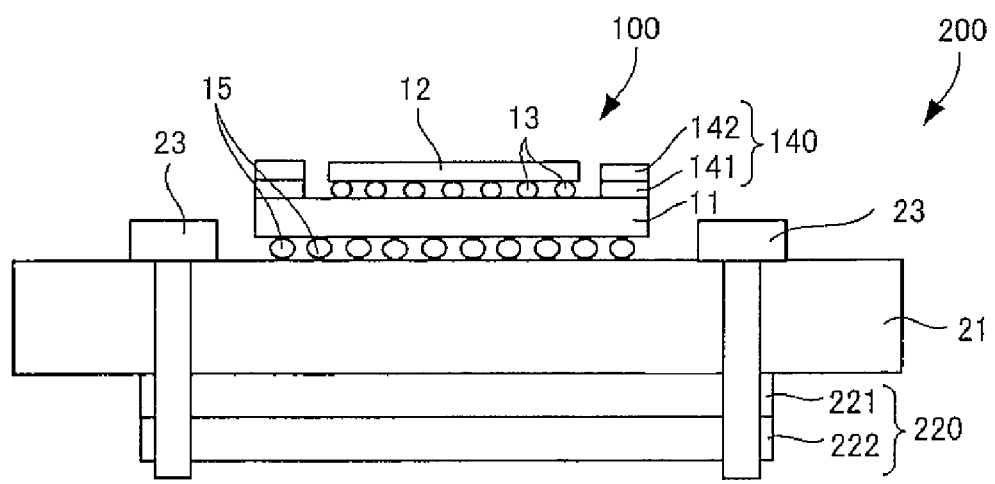
FIG. 2 is a cross-sectional configuration diagram illustrating a package mounted module according to an embodiment of the present invention.

FIG. 2 is a cross-sectional configuration diagram illustrating a package mounted module according to an embodiment of the present invention.

Here, elements of the package board module same as those illustrated in FIG. 1 are assigned with the same reference numerals and will not be explained again.

Figure 3:
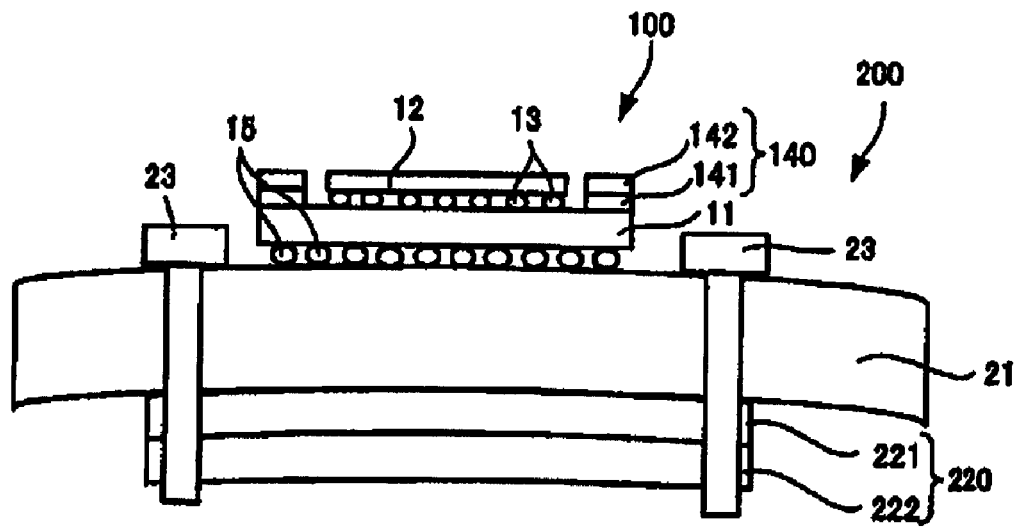
FIG. 3 is a schematic view illustrating a state of a motherboard of the package mounted module shown in FIG. 2 being warped due to a temperature change.

FIG. 3 is a schematic view illustrating a state of the motherboard of the package mounted module shown in FIG. 2 being warped due to a temperature change.

In a package mounted module 200 illustrated in FIG. 2, the entirety of the package board module 100 illustrated in FIG. 1 is mounted on the topside surface of a motherboard 21 by the fusion and fixation of solder balls 15 on the underside surface of the package board 11 shown in FIG. 1. In addition, a stiffener 220 is disposed on the underside surface of the motherboard 21 in a position to interpose the motherboard 21 between the stiffer 220 and the package board 11. The stiffener 220 has an area wider than that of the package board 11, and the motherboard 21 and the stiffener 220 are fixed to each other with screws 23 at plural locations on the periphery of the stiffener 220 falling outside the package board 11 when a stack of the package board 11, motherboard 21 and stiffener 220 is viewed from above.

Note here that the stiffener 220 has a structure wherein a first member 221 in contact with the underside surface of the motherboard 21 and a second member 222 in contact with a surface of the first member 221 farther from the motherboard 21 than the other surface thereof are adhered to each other. The second member 222 has a thermal expansion coefficient larger than that of the first member 221 and, therefore, contracts to a larger extent than does the first member when temperature drops. Consequently, the second member 222 warps in harmony with the warpage of the motherboard 21 at each temperature level from the fusion temperature of the solder balls 15 to a normal temperature, while supporting the motherboard 21, as illustrated in FIG. 3. Accordingly, it is possible to significantly reduce stress arising in solder-bonded portions between the package board 11 and the motherboard 21.

As described above, according to the embodiments described above, the stiffeners 140 and 220 tolerate the curvature (warpage) of the package board 11 and the motherboard 21, thereby significantly reducing stress arising in solder-bonded portions and greatly contributing to improving the reliability of the solder-bonded portions.

What is claimed is:

1. A package mounted module comprising:
    a package board on a topside surface of which a semiconductor chip is mounted;
    a motherboard onto a topside surface of which an underside surface of the package board is solder-bonded; and
    a first stiffener disposed on an underside surface of the motherboard in a position to interpose the motherboard between the first stiffener and the package board and fixed to the motherboard with fastening components, wherein
    the first stiffener has one layer that is farther from the motherboard than an other layer thereof in contact with the underside surface of the motherboard and that has a thermal expansion coefficient larger than that of the other layer,
    the first stiffener has an area larger than an area of the package board and is fixed to the motherboard, at a plurality of positions with the fastening components, in a region excluding a portion where the first stiffener overlaps the motherboard and outside the package board when the package board, the motherboard and the first stiffener are stacked and viewed, and
    the first stiffener has a bimetal structure formed of a first member that is the other layer in contact with the underside surface of the motherboard and a second member that is the one layer directly in contact with one surface of the first member farther from the motherboard than the other surface thereof and having a thermal expansion coefficient larger than that of the first member.

2. The package mounted module according to claim 1, wherein the fastening components are screws.

3. The package mounted module according to claim 1, wherein the package board is solder-bonded to the topside surface of the motherboard by fusion and fixation of solder balls arranged on the underside surface of the package board.

4. The package mounted module according to claim 1, further comprising a second stiffener fixed in contact with the topside surface of the package board so as to surround the semiconductor chip mounted on the topside surface of the package board, wherein the second stiffener has one layer that is farther from the package board than the other layer thereof in contact with the topside surface of the package board and that has a thermal expansion coefficient smaller than that of the other layer.

5. The package mounted module according to claim 4, wherein the second stiffener has a bimetal structure formed of a first member that is the other layer in contact with the topside surface of the package board and a second member that is the one layer in contact with one surface of the first member farther from the package board than the other surface thereof and having a thermal expansion coefficient smaller than that of the first member.

* * * * *